(12) United States Patent
Fukuda et al.

(10) Patent No.: US 7,832,352 B2
(45) Date of Patent: Nov. 16, 2010

(54) COATING TREATMENT METHOD AND COATING TREATMENT APPARATUS

(75) Inventors: Yoshiteru Fukuda, Koshi (JP); Tomohiro Iseki, Koshi (JP); Takayuki Ishii, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 831 days.

(21) Appl. No.: 11/574,888

(22) PCT Filed: Sep. 13, 2005

(86) PCT No.: PCT/JP2005/016828

§ 371 (c)(1),
(2), (4) Date: Mar. 8, 2007

(87) PCT Pub. No.: WO2006/030775

PCT Pub. Date: Mar. 23, 2006

(65) Prior Publication Data

US 2008/0193654 A1    Aug. 14, 2008

(30) Foreign Application Priority Data

Sep. 14, 2004  (JP)  ............................. 2004-266821

(51) Int. Cl.
*B05B 5/00* (2006.01)
*B05B 3/00* (2006.01)
*B05B 7/06* (2006.01)

(52) U.S. Cl. .................. 118/641; 118/642; 118/323; 118/321; 118/313; 118/58

(58) Field of Classification Search ............ 118/52, 118/612, 318, 319, 313–315, 56, 321, 641–643, 118/323, 58–60; 427/240, 427.1, 427.3; 396/604, 611, 627; 134/153, 198, 902
See application file for complete search history.

(56) References Cited

U.S. PATENT DOCUMENTS 6,284,044 B1 *   9/2001   Sakamoto et al. ............ 118/219

(Continued)

FOREIGN PATENT DOCUMENTS

JP          2 201924          8/1990

(Continued)

*Primary Examiner*—Yewebdar T Tadesse
(74) *Attorney, Agent, or Firm*—Oblon, Spivak, McClelland, Maier & Neustadt, L.L.P.

(57) ABSTRACT

To perform a series of resist coating treatments from application of a resist solution to removal of a resist film on a wafer edge portion in a shorter time.

A laser irradiation unit for applying a laser light is provided in a resist coating unit. At the time of resist coating treatment, the resist solution is discharged onto a central portion of the rotated wafer from a resist solution supply nozzle to form a resist film on the wafer. Thereafter, the laser irradiation unit moves to an outer peripheral portion of the wafer and applies the laser light onto the resist film on the outer peripheral portion to dry the resist film on the outer peripheral portion. After the resist film on the outer peripheral portion dries, the application of laser light is continued, and the solvent supply nozzle moves to a position above the edge portion of the wafer and supplies the solvent to the resist film on the edge portion of the wafer. The supply of the solvent dissolves and removes the resist film on the edge portion of the wafer.

4 Claims, 11 Drawing Sheets

U.S. PATENT DOCUMENTS

2001/0041229 A1 * 11/2001 Sakamoto et al. ........... 427/555
2003/0077399 A1 * 4/2003 Potyrailo et al. ............ 427/532

FOREIGN PATENT DOCUMENTS

| | | |
|---|---|---|
| JP | 6 283417 | 10/1994 |
| JP | 8 107053 | 4/1996 |
| JP | 11 333355 | 12/1999 |
| JP | 2003 181361 | 7/2003 |
| JP | 2003 535483 | 11/2003 |

* cited by examiner

COATING TREATMENT METHOD AND COATING TREATMENT APPARATUS

TECHNICAL FIELD

The present invention relates to a coating treatment method and a coating treatment apparatus for a substrate.

BACKGROUND ART

In photolithography process steps in a manufacturing process of a semiconductor device, for example, a resist coating treatment for forming a resist film on a semiconductor wafer (hereinafter, referred to as a "wafer") is performed.

In the resist coating treatment, a resist solution is usually supplied to a center of the wafer with the wafer held on a spin chuck and rotated. The resist solution supplied to the center of the wafer is spread by the centrifugal force to the entire front surface of the wafer to form a resist film on the wafer. Thereafter a so-called edge rinse for removing the resist film on an edge portion of the wafer is performed (see Patent Document 1). The edge rinse can prevent the resist film on the wafer from adhering, for example, to a transfer arm and a chuck of another unit to generate particles.

Incidentally the edge rinse is a treatment for selectively removing only the resist film on the edge portion of the wafer as described above, and if it is performed with the resist film on the wafer not sufficiently dried, the resist film at the central portion of the wafer flows out onto the edge portion of the wafer from which the resist film is to be removed, thereby contaminating the edge portion of the substrate to waste the edge rinse. Therefore, the edge rinse is performed after a resist film is formed on the wafer and the resist film is sufficiently dried.

However, it takes a long time from when the resist film is formed until when the resist film sufficiently dries. Actually, it might take two or more minutes for the resist film to sufficiently dry, depending on the kind of the resist solution, even if the wafer is rotated.

As described above, it takes time to dry the resist film in the prior art, so that the start of the edge rinse is delayed to increase the required total time for the resist coating treatment, resulting in decreased throughput. Accordingly, to increase the efficiency of treating the wafer, for example, it is necessary to install a number of resist coating units in a coating and developing treatment system in which a series photolithography process steps is successively performed, leading to an increased size of the coating and developing treatment system.

[Patent Document]
Japanese Patent Application Laid-open No. H8-107053

DISCLOSURE OF THE INVENTION

Problems to be Solved by the Invention

The present invention has been developed in consideration of the above points, and its object is to perform a coating treatment such as a resist coating treatment including an edge rinse in a shorter time than that in the prior art.

Means for Solving the Problems

To achieve the above object, the present invention is a coating treatment method of supplying a coating solution to a substrate to treat the substrate, including the steps of supplying the coating solution onto the substrate to form a coating film on the substrate; thereafter, supplying heat to the coating film on an outer peripheral portion of the substrate to dry the coating film on the outer peripheral portion; thereafter, while continuously supplying heat to the coating film on the outer peripheral portion of the substrate, supplying a solvent for the coating film to the coating film on an edge portion of the substrate on an outer side in a region to which the heat is supplied, to remove the coating film on the edge portion.

Note that, in the present invention, "the edge portion of the substrate" refers to a region having a width from the end portion of the substrate to a portion inside from the end portion by a predetermined width, and "the outer peripheral portion of the substrate" refers to a region having a width from the end portion of the substrate to a portion further inside from edge portion.

According to the present invention, since the heat is applied to the coating film formed on the outer peripheral portion of the substrate to dry it, the coating film on the outer peripheral portion can be dried in a short time. Further, since the heat is continuously applied to the coating film on the outer peripheral portion of the substrate when supplying the solvent to remove the coating film on the edge portion of the substrate, it is possible to prevent the coating film near the outer peripheral portion of the substrate from being deprived of heat by the solvent or the coating film from absorbing the solvent to dissolve and flow toward the end portion side of the substrate. This allows the removal of the coating film on the edge portion of the substrate to be appropriately performed.

According to another aspect, the present invention is a coating treatment apparatus for supplying a coating solution to a substrate to treat the substrate, including a coating solution supply member for supplying the coating solution onto the substrate to form a coating film on the substrate; a heat supply member for supplying heat to the coating film on an outer peripheral portion of the substrate; and a solvent supply member for supplying a solvent for the coating film to the coating film on an edge portion of the substrate on an outer side in a region to which the heat is supplied by the heat supply member. The heat supply member may be located on an upper surface side of the substrate, or may be located on a rear surface side of the substrate.

According to the present invention, the heat supply member can apply heat to the coating film formed on the outer peripheral portion of the substrate and therefore dry the coating film on the outer peripheral portion of the substrate in a short time. Further, since the heat can be continuously supplied to the coating film on the outer peripheral portion of the substrate when the solvent supply member supplies the solvent to the coating film on the edge portion of the substrate to remove the coating film on the edge portion, it is possible to prevent the coating film, for example inside the edge portion of the substrate from being deprived of heat by the solvent or the coating film from absorbing the solvent to dissolve and flow toward the end portion side of the substrate. This allows the removal of the coating film on the edge portion of the substrate to be appropriately performed. Further, since the supply of heat to the coating film on the outer peripheral portion of the substrate is performed from the rear surface side of the substrate, for example, the volatile component during dry never contaminates the heat supply member. Further, it is possible to prevent impurities such as dust and so on from dropping from the heat supply member onto the coating film on the substrate.

In the prevent invention, the heat supply member and the solvent supply member may be configured to be movable to positions opposed to each other with the outer peripheral portion of the substrate intervening therebetween. In this case, the supply of heat from the rear surface side of the substrate by the heat supply member and the supply of the solvent from the front surface side of the substrate by the solvent supply member are performed at the same position as seen from plane view. Therefore, heat wave radiated from the heat supply member can be interrupted and absorbed by the solvent supplied from the solvent supply member, so that the heat wave can be prevented from scattering to portions other than the coating film on the outer peripheral portion of the substrate. This can prevent the heat wave from being unevenly applied to the coating film other than that on the outer peripheral portion and affecting the coating film.

The heat supply member may be a lamp heater, the lamp heater may be provided with a reflector for reflecting heat wave of the lamp heater toward the rear surface side of the substrate, the reflector may be formed to cover a periphery of the lamp heater and further have, on the substrate side, an opening portion through which the heat wave passes, and the reflector may be formed such that the reflector is tapered as the reflector approaches the opening portion on the substrate side. In this case, it is possible to prevent, for example, the solvent from flowing into the reflector covering the lamp heater, and therefore prevent the solvent from adhering to the lamp heater and contaminating it. The heat supply member may be a laser irradiation member.

EFFECT OF THE INVENTION

According to the present invention, the coating treatment time is shortened, so that the throughput can be improved.

EXPLANATION OF CODES 1 coating and developing treatment system
20 resist coating unit
133 resist solution supply nozzle
150 solvent supply nozzle
173 laser irradiation member
W wafer

BEST MODE FOR TRANSFERRING OUT THE INVENTION

Figure 1:
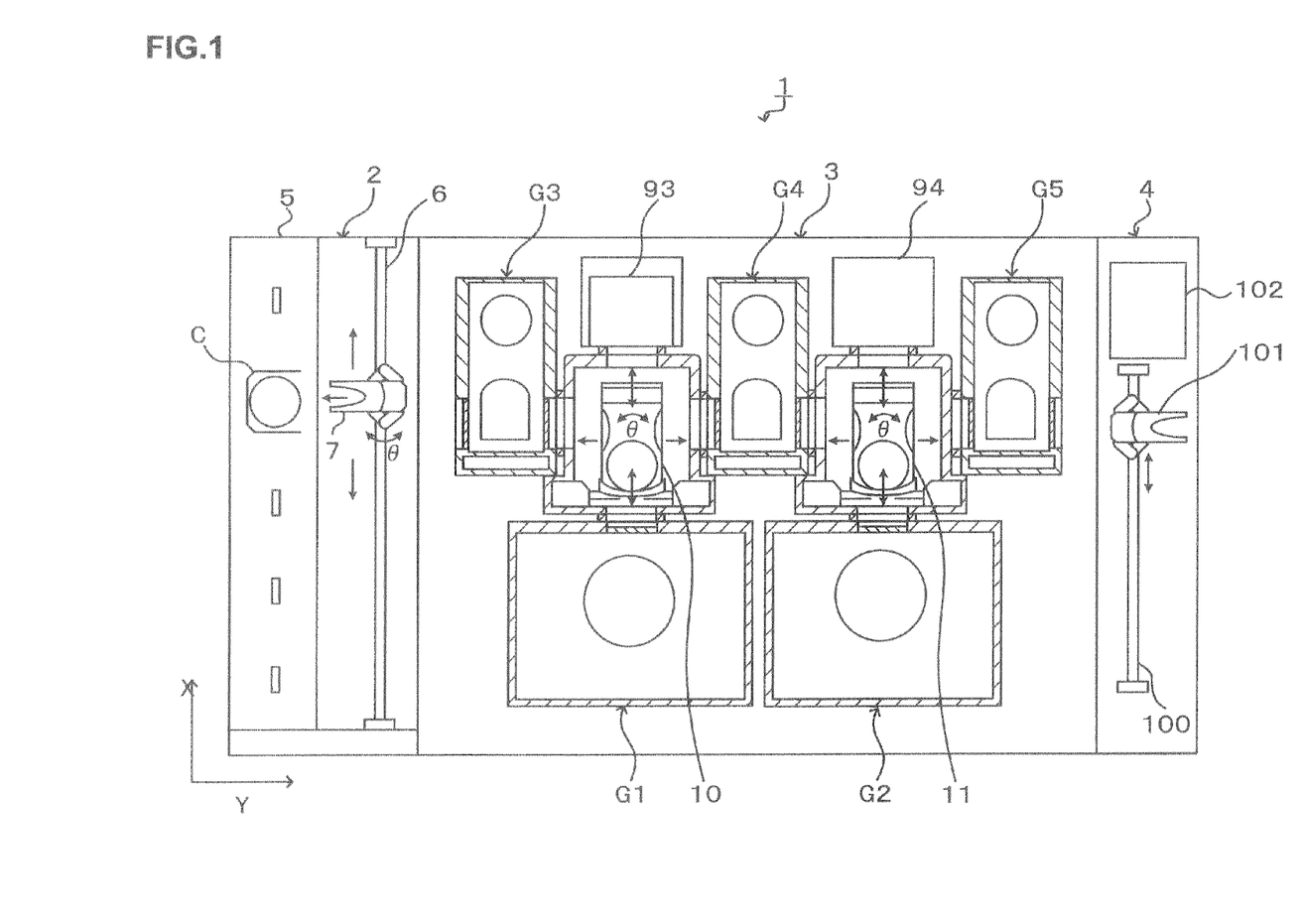
FIG. 1 A plan view showing the outline of a configuration of a coating and developing treatment system in the present embodiment.
Figure 2:
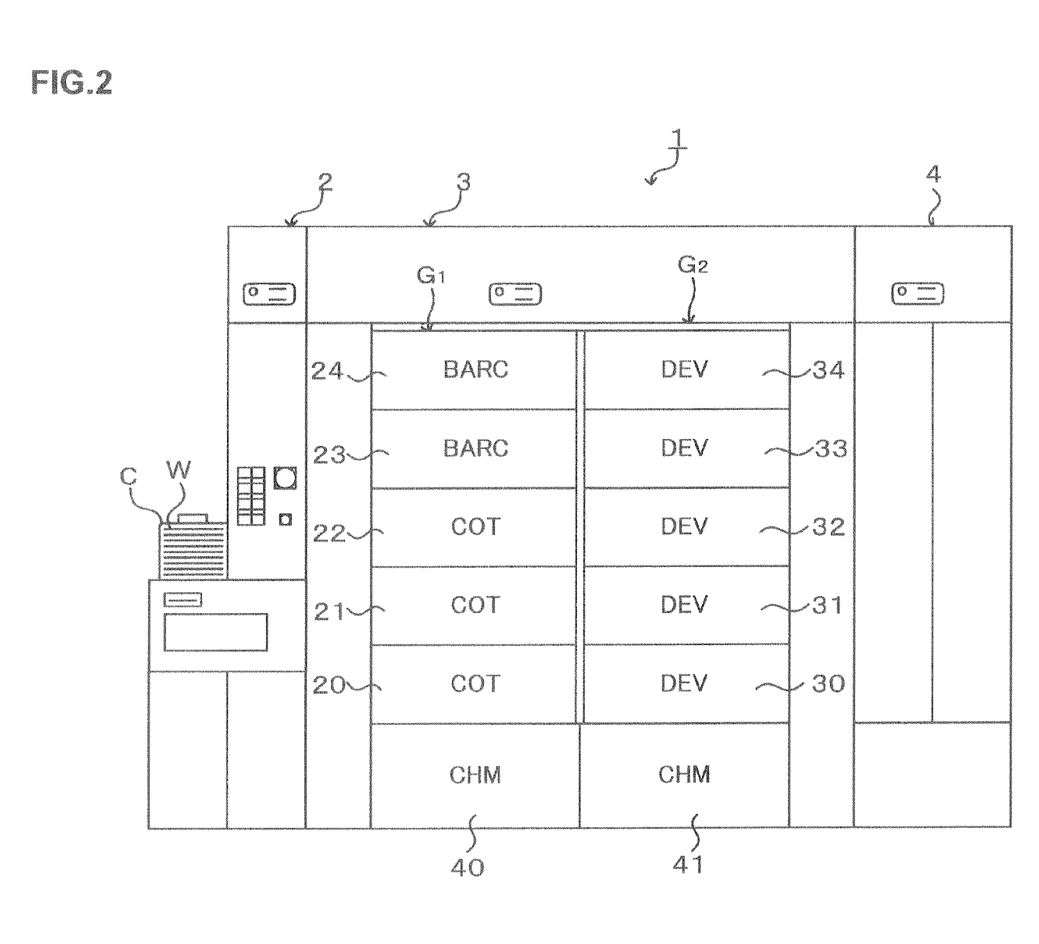
FIG. 2 A front view of the coating and developing treatment system in FIG. 1
Figure 3:
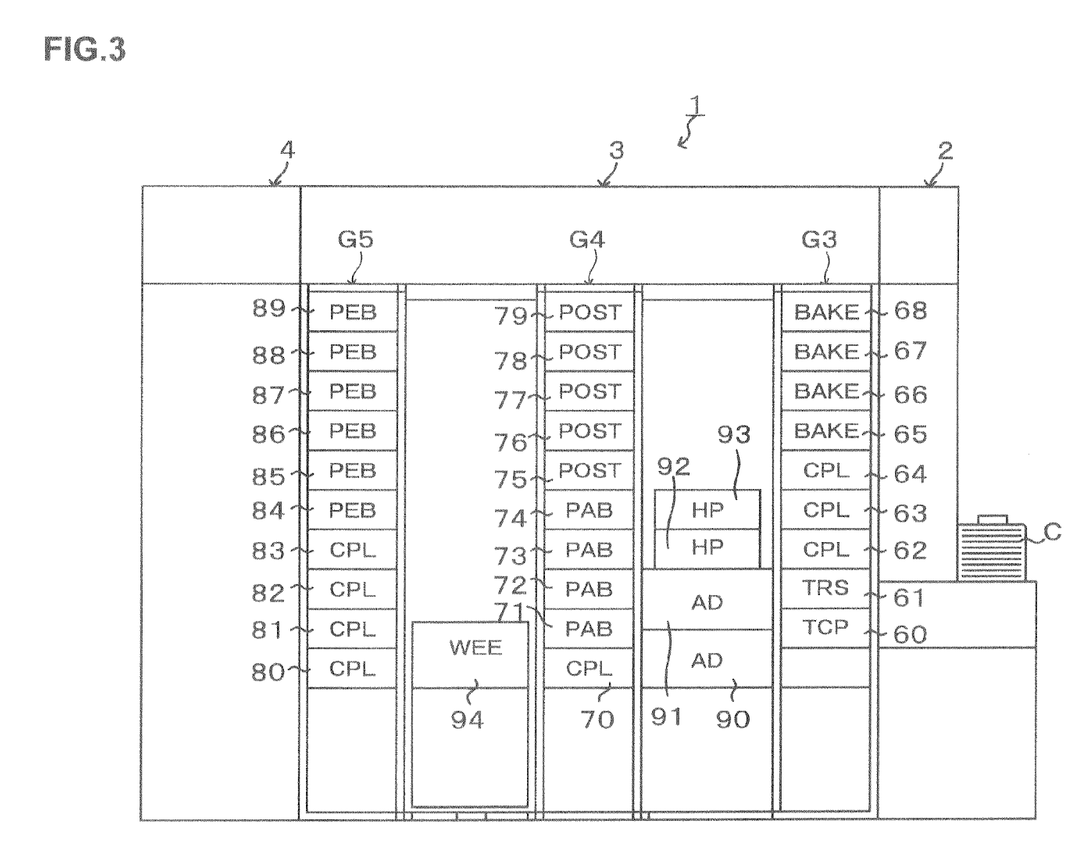
FIG. 3 A rear view of the coating and developing treatment system in FIG. 1.

Hereinafter a preferred embodiment of the present invention will be described. FIG. 1 is a plan view showing the outline of a configuration of a coating and developing treatment system 1 incorporating a coating treatment apparatus according to the present invention, FIG. 2 is a front view of the coating and developing treatment system 1, and FIG. 3 is a rear view of the coating and developing treatment system 1.

The coating and developing treatment system 1 has, as shown in FIG. 1, a configuration in which, for example, a cassette station 2 for transferring, for example, 25 wafers W per cassette as a unit from/to the outside into/from the coating and developing treatment system 1 and transferring the wafers W into/out of a cassette C; a processing station 3 including a plurality of various kinds of processing and treatment apparatuses, which are multi-tiered, for performing various kinds of processing and treatments in a single wafer processing in the coating and developing treatment steps, and an interface station 4 for passing the wafer W to/from a not-shown aligner provided adjacent to the processing station 3, are integrally connected.

In the cassette station 2, a plurality of cassettes C can be mounted at predetermined positions on a cassette mounting table 5 in a line in a X-direction (a top-to-bottom direction in FIG. 1). In the cassette station 2, a wafer transfer body 7 is provided which is movable in the X-direction on a transfer path 6. The wafer transfer body 7 is also movable in a wafer-arrangement direction of the wafers W housed in the cassette C (a Z-direction; the vertical direction), and thus can selectively access the wafers W in each of the cassettes C arranged in the X-direction.

The wafer transfer body 7 is rotatable in a θ-direction around the Z-axis, and can access a temperature regulating unit 60 and a transition unit 61 which are included in a later-described third processing unit group G3 on the processing station 3 side.

The processing station 3 adjacent to the cassette station 2 includes for example, five processing unit groups G1 to G5 in each of which a plurality of processing and treatment units are multi-tiered. On the side of the negative direction in the X-direction (the downward direction in FIG. 1) in the processing station 3, the first processing unit group G1 and the second processing unit group G2 are placed in order from the cassette station 2 side. On the side of the positive direction in the X-direction (the upward direction in FIG. 1) in the processing station 3, the third processing unit group G3, the fourth processing unit group G4, and the fifth processing unit group G5 are placed in order from the cassette station 2 side. Between the third processing unit group G3 and the fourth processing unit group G4, a first transfer unit 10 is provided. The first transfer unit 10 can selectively access the processing and treatment units in the first processing unit group G1, the third processing unit group G3, and the fourth processing unit group G4 and transfer the wafer W to them. Between the fourth processing unit group G4 and the fifth processing unit group G5, a second transfer unit 11 is provided. The second transfer unit 11 can selectively access the processing and treatment units in the second processing unit group G2, the fourth processing unit group G4, and the fifth processing unit group G5 and transfer the wafer W to them.

In the first processing unit group G1, as shown in FIG. 2, solution treatment units each for supplying a predetermined liquid to the wafer W to perform treatment, for example, resist coating units 20, 21, and 22 each as a coating treatment unit according to the present embodiment, and bottom coating units 23 and 24 each forming an anti-reflection film as a base film that prevents reflection of light during exposure processing, are five-tiered in order from the bottom. In the second processing unit group G2, solution treatment units, for example, developing treatment units 30 to 34 each for supplying a developing solution to the wafer W to develop it are five-tiered in order from the bottom. Further, chemical chambers 40 and 41 each for supplying various kinds of treatment solutions to the solution treatment units in the processing unit groups G1 and G2 are provided on the lowermost tiers of the first processing unit group G1 and the second processing unit group G2, respectively.

As shown in FIG. 3, in the third processing unit group G3, for example, the temperature regulating unit 60, the transition unit 61 for passing the wafer W, high-precision temperature regulating units 62 to 64 each for temperature-regulating the wafer W under temperature control with a high precision, and high-temperature heat processing units 65 to 68 each for heat processing the wafer W at a high temperature, are nine-tiered in order from the bottom.

In the fourth processing unit group G4, for example, a high-precision temperature regulating unit 70, pre-baking units 71 to 74 each for heat-processing the wafer W after the resist coating treatment, post-baking units 75 to 79 each for heat-processing the wafer W after developing treatment, are ten-tiered in order from the bottom.

In the fifth processing unit group G5, a plurality of thermal processing units each for performing thermal processing for the wafer W, for example, high-precision temperature regulating units 80 to 83, and post-exposure baking units 84 to 89 each for heat-processing the wafer W after exposure, are ten-tiered in order from the bottom.

As shown in FIG. 1, a plurality of processing and treatment units are arranged on the positive direction side in the X-direction of the first transfer unit 10, for example, adhesion units 90 and 91 each for performing hydrophobic treatment on the wafer W and heating units 92 and 93 each for heating the wafer W being four-tiered in order from the bottom as shown in FIG. 3. As shown in FIG. 1, for example, an edge exposure unit 94 for selectively exposing only the edge portion of the wafer W to light is disposed on the positive direction side in the X-direction of the second transfer unit 11.

In the interface section 4 for example, a wafer transfer body 101 moving on a transfer path 100 extending in the X-direction and a buffer cassette 102 are provided as shown in FIG. 1. The wafer transfer body 101 is movable in the Z-direction and also rotatable in the θ-direction and thus can access the not-shown aligner adjacent to the interface section 4, the buffer cassette 102 and the processing units in the fifth processing unit group G5 and transfer the wafer W to them.

Figure 4:
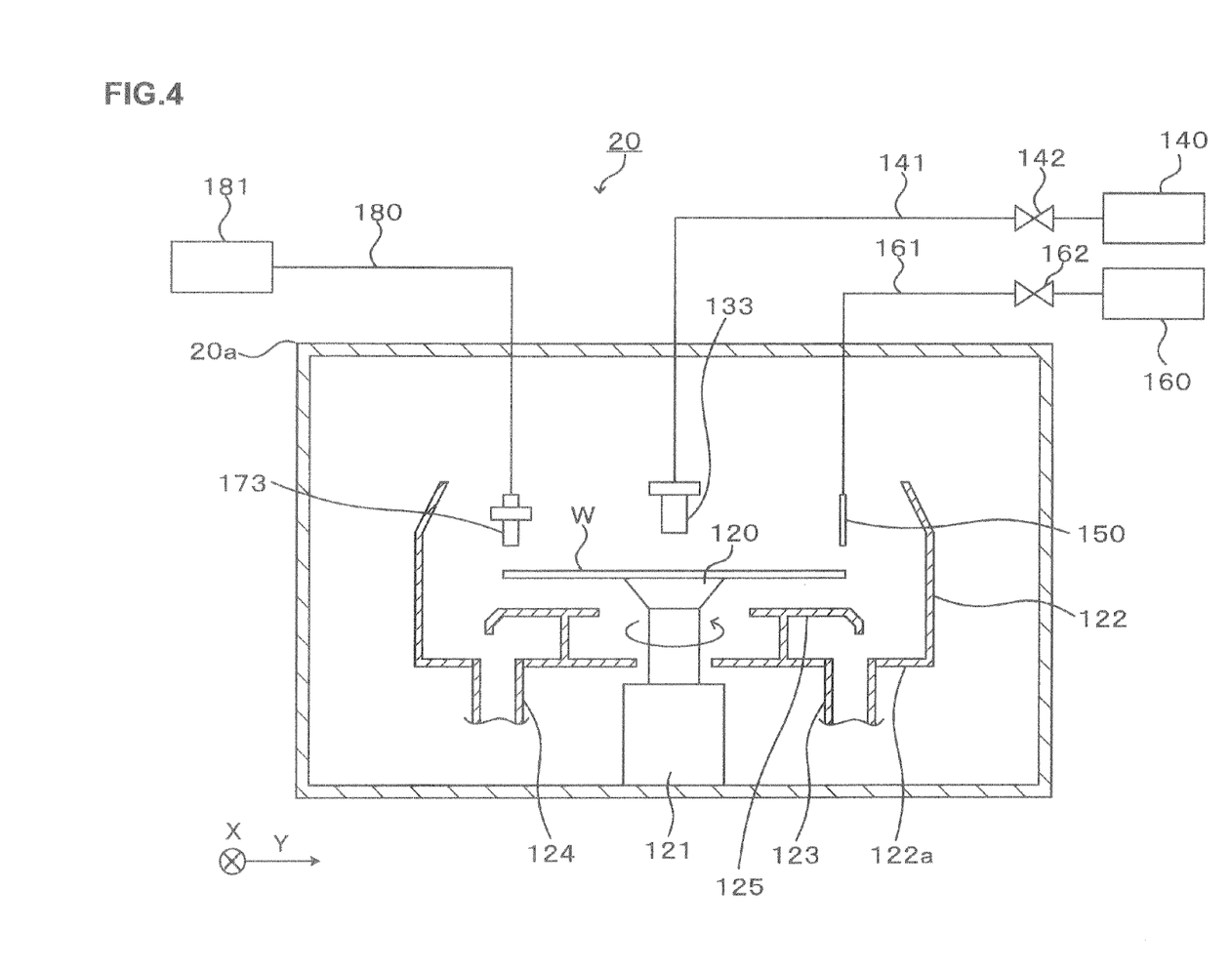
FIG. 4 An explanatory view of a longitudinal section showing the outline of a configuration of a resist coating unit.
Figure 5:
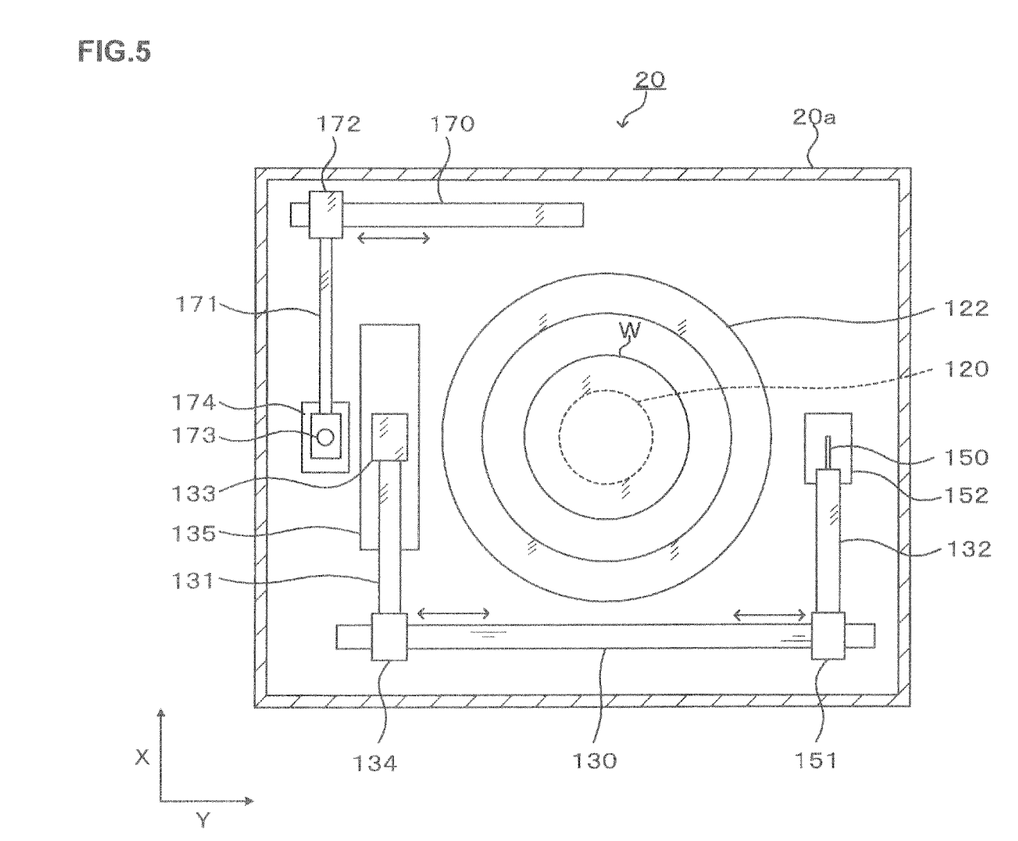
FIG. 5 An explanatory view of a transverse section showing the outline of the configuration of the resist coating unit.

Next, the configuration of the above-described resist coating unit 20 will be described in detail. FIG. 4 is an explanatory view of a longitudinal section showing the outline of the configuration of the resist coating unit 20, and FIG. 5 is an explanatory view of a transverse section showing the outline of the configuration of the resist coating unit 20.

As shown in FIG. 4 the resist coating unit 20 has a casing 20*a*. At the central portion in the casing 20*a*, a spin chuck 120 as a holding member for holding the wafer W is provided. The spin chuck 120 has a horizontal upper surface which is provided with, for example, a suction port (not shown) for sucking the wafer W. Suction from the suction port allows the wafer W to be sucked onto the spin chuck 120.

The spin chuck 120 is provided with, for example, a chuck drive mechanism 121 for rotating and raising and lowering the spin chuck 120. The chuck drive mechanism 121 includes for example, a rotary drive unit (not shown) such as a motor for rotating the spin chuck 120 at a predetermined speed, and a raising and lowering unit (not shown) such as a motor or a cylinder for raising and lowering the spin chuck 120. The chuck drive mechanism 121 can raise and lower the wafer W on the spin chuck 120 at a predetermined timing and rotate the wafer 7 at a predetermined speed.

Around the spin chuck 120, a cup 122 is provided for receiving and collecting the resist solution the solvent, and the like scattering from the wafer W. The cup 122 has an almost cylindrical shape with its upper face open, and is formed to surround the outside and the lower side of the wafer W on the spin chuck 120. A lower surface 122*a* of the cup 122 is provided with a drain pipe 123 for draining the collected resist solution and the like and an exhaust pipe 124 for exhausting the atmosphere in the cup 122.

Inside the cup 122 and below the wafer W held on the spin chuck 120, a horizontal plate 125 in an almost horizontal plate shape is formed which faces the rear surface of the wafer W. The horizontal plate 125 is formed in a ring shape to surround the spin chuck 120.

As shown in FIG. 5, a rail 130 extending along the Y-direction is formed for example, on the negative direction side in the X-direction (the lower direction in FIG. 5) of the cup 122. The rail 130 is formed, for example from the outside of the cup 122 on the negative direction side in the Y-direction (the left direction in FIG. 5) to outside of the cup 122 on the positive direction side in the Y-direction (the right direction in FIG. 5). To the rail 130, for example, two arms 131 and 132 are attached. On the first arm 131, a resist solution supply nozzle 133 as a coating solution supply member is supported. The first arm, 131 can move in the Y-direction on the rail 130 by means of a nozzle drive unit 134. The first arm 131 allows the resist solution supply nozzle 133 to be moved from a waiting section 135 provided outside the cup 122 on the negative direction side in the Y-direction to a position above the wafer W in the cup 122. The first arm 131 is also movable in the vertical direction for example, by means of the nozzle drive unit 134 and can raise and lower the resist solution supply nozzle 133.

To the resist solution supply nozzle 133, a resist solution supply pipe 141 is connected which is in communication with a resist solution supply source 140 located outside the casing 20*a*, for example, as shown in FIG. 4. The resist solution supply pipe 141 is provided with an opening/closing valve 142 which can control a timing of supplying the resist solution.

As shown in FIG. 5, on the second arm 132, a solvent supply nozzle 150 is supported as a solvent supply member for supplying a solvent for the resist solution to remove the resist film. The second arm 132 can move in the Y-direction on the rail 130 for example, by means of a nozzle drive unit 151. The second arm 132 allows the solvent supply nozzle 150 to be moved from a waiting section 152 provided outside the cup 122 on the positive direction side in the Y-direction to a position above the wafer W in the cup 122. The second arm 132 is also movable in the vertical direction for example, by means of the nozzle drive unit 151 and can raise and lower the solvent supply nozzle 150.

To the solvent supply nozzle 150, a solvent supply pipe 161 is connected which is in communication with a solvent supply source 160 provided outside the casing 20a for example, as shown in FIG. 4. The solvent supply pipe 161 is provided with an opening/closing valve 162 which can control a timing of supplying the solvent.

As shown in FIG. 5, a rail 170 extending along the Y-direction is formed, for example, on the positive direction side in the X-direction (the upper direction in FIG. 5) of the cup 122. The rail 170 is formed, for example, from the outside of the cup 122 on the negative direction side in the Y-direction to the vicinity of the central portion of the cup 122. To the rail 170, for example a third arm 171 is attached. The third arm 171 can move in the Y-direction on the rail 170, for example, by means of a drive unit 172. On the third arm 171, a laser irradiation member 173 as a heat supply member is supported. The third arm 171 allows the laser irradiation member 173 to be moved from a waiting section 174 outside the cup 122 on the negative direction side in the Y-direction to a position above the wafer W in the cup 122. The third arm 171 is also movable in the vertical direction, for example, by means of the drive unit 172 and can raise and lower the laser irradiation member 173 to thereby adjust the height of the laser irradiation member 173.

The laser irradiation member 173 is connected to a laser oscillator 181 via a cable 180, or example, as shown in FIG. 4. In this embodiment, the laser oscillator 181 oscillates a far-infrared laser light having for example, a wavelength of about 1000 nm to about 1200 nm, so that the laser irradiation member 173 can apply the far-infrared laser light.

Next, the process of the resist coating treatment performed in the above-described resist coating unit 20 will be explained if conjunction with the process of the photolithography process steps performed in the coating and developing treatment system 1.

First of all, one wafer W is taken out of the cassette C on the cassette mounting table 5 by the wafer transfer body 7 and transferred to the temperature regulating unit 60 in the third processing unit group G3. The wafer W transferred to the temperature regulating unit 60 is temperature-regulated to a predetermined temperature, and is then transferred by the first transfer unit 10 into the bottom coating unit 23 where a anti-reflection film is formed. The wafer W on which the antireflection film has been formed is sequentially transferred by the first transfer unit 10 to the heating unit 92 the high-temperature thermal processing unit 65, and the high-precision temperature regulating unit 70 so that predetermined processing is performed in each of the units. Thereafter a resist film is formed on the wafer W in the resist coating unit 20.

The wafer W on which the resist film has been formed is transferred by the first transfer unit 10 to the pre-baking unit 71 and subsequently transferred by the second transfer unit 11 to the edge exposure unit 94 and the high-precision temperature regulating unit 83 in sequence so that the wafer W is subjected to predetermined processing in each of the units. Thereafter the wafer W is transferred by the wafer transfer body 101 in the interface section 4 to the not-shown aligner. In the aligner, a predetermined patter is exposed to light on the resist film on the wafer W. The wafer W for which exposure processing has been finished is transferred by the wafer transfer body 101, for example, to the post-exposure baking unit 84 where the wafer W is subjected to heat-processing and then transferred by the second transfer unit 11 to the high-precision temperature regulating unit 81 where the wafer W is temperature-regulated. The wafer W is then transferred to the developing treatment unit 30 where the resist film on the wafer W is developed. The wafer W for which developing treatment has been finished is transferred for example, by the second transfer unit 11 to the post-baking unit 75 where the wafer W is subjected to heat-processing and then transferred to the high-precision temperature regulating unit 63 where the wafer W is temperature-regulated. The wafer W is then transferred by the first transfer unit 10 to the to the transition unit 61 and returned to the cassette C by the wafer transfer body 7. Thus, a series of photolithography process steps in the coating and developing treatment system 1 ends.

Figure 6:
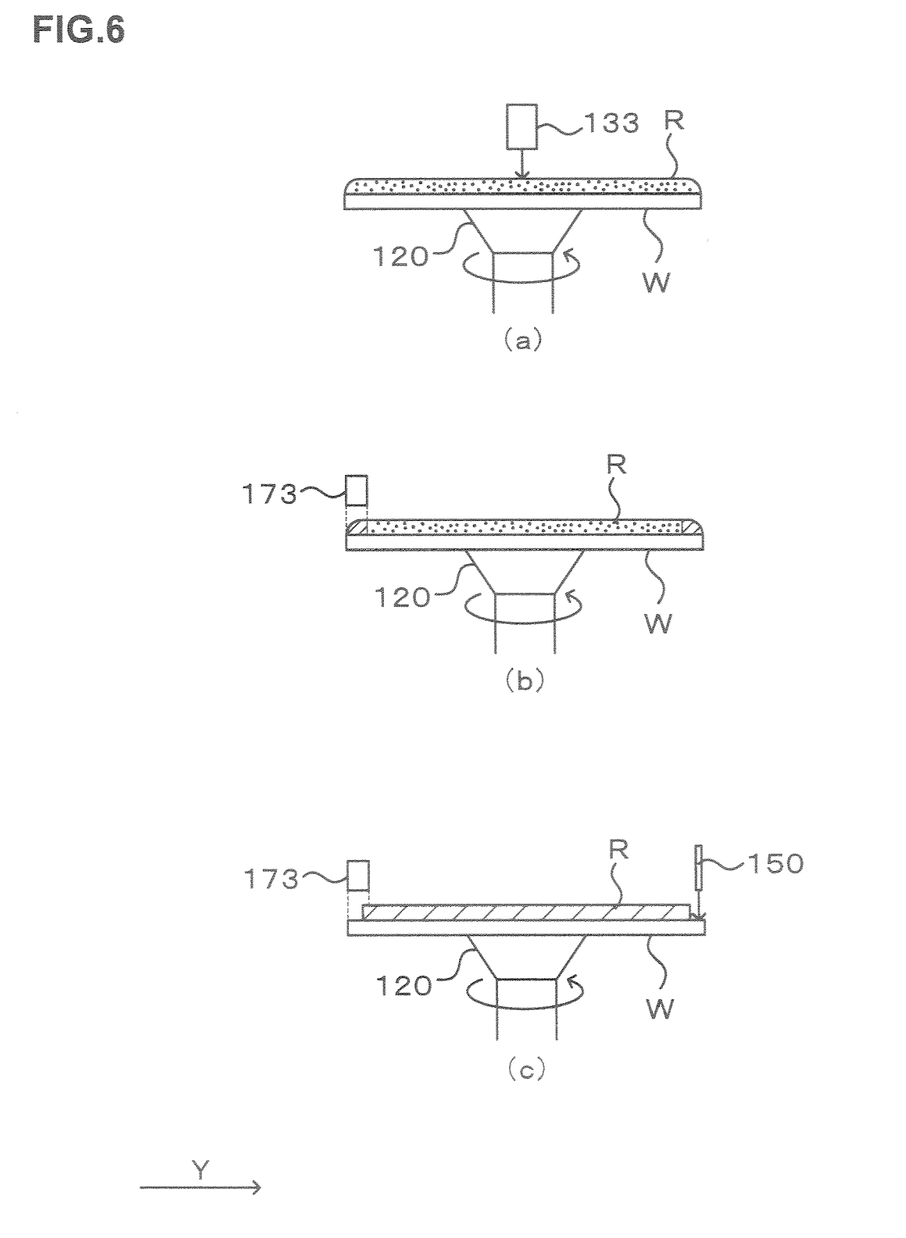
FIG. 6 An explanatory view of a flow of a resist coating treatment.

The resist coating treatment performed in the above-described resist coating unit 20 will be described now in detail. FIG. 6 is an explanatory view showing the flow of the resist coating treatment. First of all, which the wafer W is transferred into the resist coating unit 20 and held on the spin chuck 120 as shown in FIG. 4, the resist solution supply nozzle 133 waiting at the waiting section 135 moves toward the positive direction side in the Y-direction to a position above the central portion of the wafer W. Subsequently the wafer W is, for example, rotated by the spin chuck 120, and a predetermined amount of resist solution is discharged onto the central portion of the rotated wafer W from the resist solution supply nozzle 133 ((a) in FIG. 6). The resist solution discharged on the wafer W is spread by the centrifugal force, so that the resist solution is applied over the entire front surface of the wafer W. Thereafter, the wafer W is continuously rotated for a predetermined time, whereby the excessive resist solution on the front surface of the wafer scatters, resulting in formation of a resist film R with a predetermined thickness on the wafer W.

Figure 7:
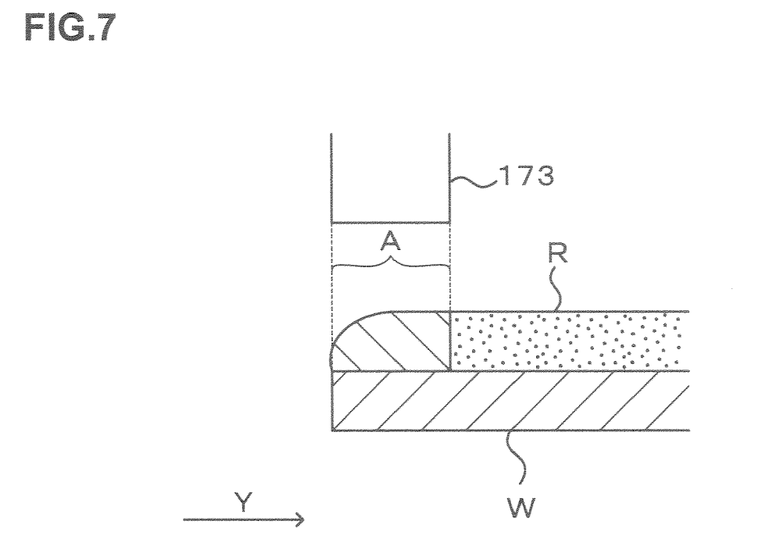
FIG. 7 A longitudinal sectional view of a wafer showing an appearance in which a laser light is applied to a resist film on an outer peripheral portion of the wafer.

The resist solution supply nozzle 133 retracts to the waiting section 135 after completing the discharge of the predetermined amount of resist solution onto the central portion of the wafer W, and the laser irradiation member 173 instead moves from the waiting section 174 to a position above the outer peripheral portion of the wafer W on the negative direction side in the Y-direction ((b) in FIG. 6). Then, immediately after the resist film R with the predetermined thickness is formed on the wafer W, the far-infrared laser light is applied onto the resist film R on the outer peripheral portion in an annular form of the wafer W with the wafer W continuously rotated. The application of the laser light dries the resist film R on an outer peripheral portion A of the wafer W with the thermal energy of the layer light as shown in FIG. 7.

Figure 8:
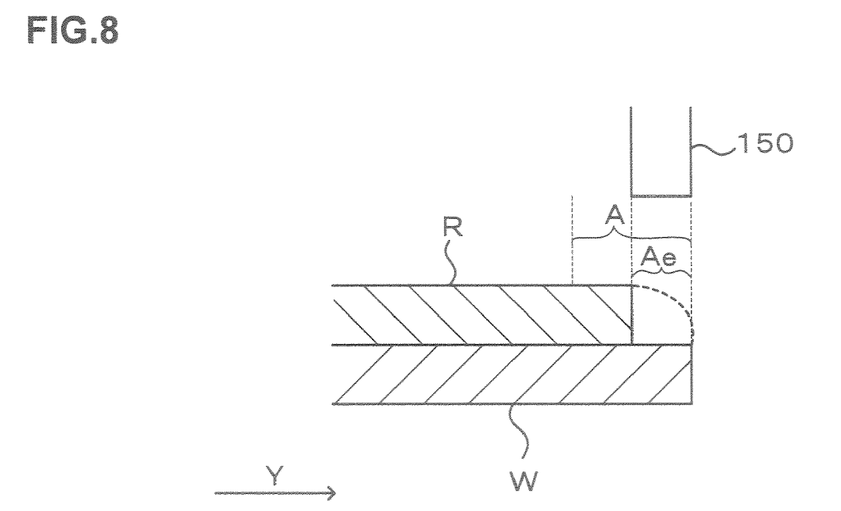
FIG. 8 A longitudinal sectional view of the wafer showing an appearance in which the resist film on an edge portion of the wafer is being removed.

Upon drying of the resist film R on the outer peripheral portion A of the wafer W, for example the solvent supply nozzle 150 moves to a position above an edge portion Ae of the wafer W on the positive direction side in the Y-direction ((c) in FIG. 6). The solvent is discharged onto the resist film R at the edge portion Ae on the outer side in the outer peripheral portion A of the wafer W from the solvent supply nozzle 150 with the wafer W continuously rotated and the laser light continuously applied thereto. The discharge of the solvent dissolves and removes the resist film R on the edge portion Ae with a predetermined width on the outer side in the outer peripheral portion A of the wafer W, for example, as shown in FIG. 8 (edge rinse). In addition, the continuously performed application of the laser light prevents the resist film R on the inner side of the edge portion Ae of the wafer W from dissolving with the solvent or due to the low temperature of the solvent, and keeps the resist film R dried. Further, during removal of the resist film R on the edge portion Ae, the resist film R on the inner side of the outer peripheral portion A also dries so that the whole resist film R dries.

After the resist film R on the edge portion Ae of the wafer W is removed, the rotation of the wafer W is stopped, and the supply of the solvent from the solvent supply nozzle 150 and the application of the laser light from the laser irradiation member 173 are stopped. The solvent supply nozzle 150 is then returned to the waiting section 152, and the laser irradiation member 173 is returned to the waiting section 174. The wafer W on the spin chuck 120 is then transferred out of the resist coating unit 20 by the first transfer unit 10, with which a series of resist coating treatments ends.

According to the above embodiment after the resist film R is formed on the wafer W, the laser light is applied to the resist film R on the outer peripheral portion A of the wafer W by the laser irradiation member 173 to provide heat thereto, so that the resist film R on the outer peripheral portion A dries in a short time. As a result, the removal of the resist film R on the edge portion Ae by the solvent supply nozzle 150 can be started earlier, resulting in shortened total resist coating treatment time. Further, the laser light can be continuously applied to the resist film R on the entire outer peripheral portion A of the wafer W during the supply of the solvent to the resist film R on the edge portion Ae by the solvent supply nozzle 150, thereby preventing the resist film R on the inner side of the edge portion Ae from which the resist film R is to be removed from dissolving with the solvent and flowing into a portion thereof to be removed. Accordingly, the removal of the resist film R on the edge portion Ae of the wafer W can be appropriately performed without leaving contamination.

Figure 9:
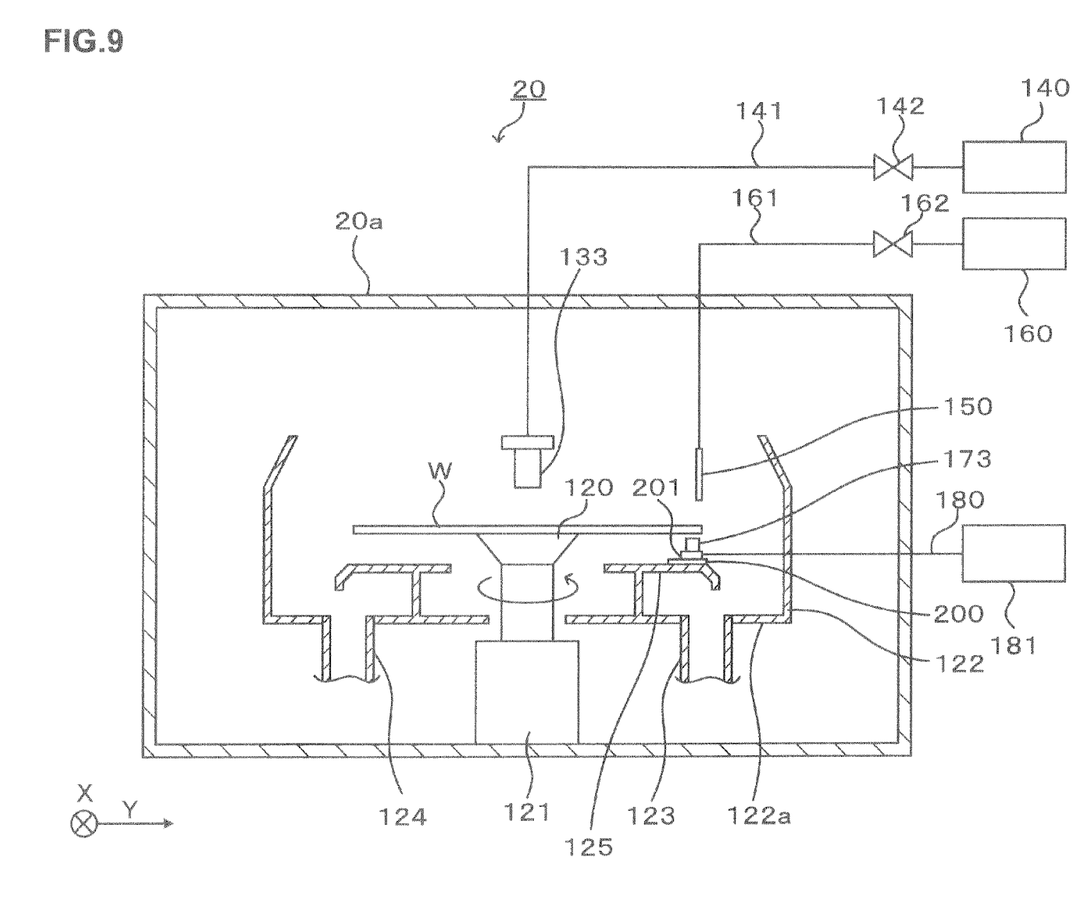
FIG. 9 An explanatory view of a longitudinal section showing the outline of a configuration of the resist coating unit in which a laser irradiation member is provided below the wafer.
Figure 10:
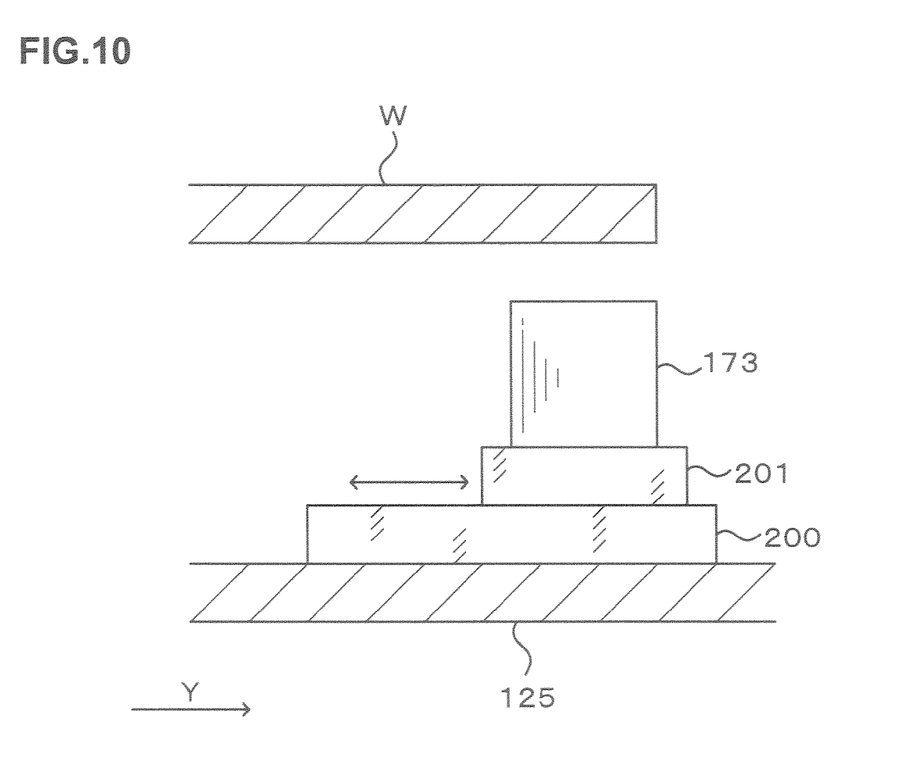
FIG. 10 An explanatory view showing a moving mechanism of the laser irradiation member.

Although the laser irradiation member 173 applies the laser light from above the wafer W in the above embodiment, the laser light may be applied from the rear surface side of the wafer W. In this case, ache laser irradiation member 173 is provided for example, on the rear surface side of the wafer W held on the spin chuck 120 as shown in FIG. 9. A rail 200 extending along the direction of the diameter of the wafer W as shown in FIG. 10 is provided on the horizontal plate 125 located, for example, on the positive direction side in the Y-direction of the spin chuck 120, and the laser irradiation member 173 is attached to a slider 201 moving on the rail 200. The laser irradiation member 173 is movable along the rail 200 and can move to a position below the outer peripheral portion A of the wafer W on the positive direction side in the Y-direction. This allows the laser irradiation member 173 to move to a position opposed to the solvent supply nozzle 150 at the time when discharging the solvent with the wafer W intervening therebetween.

Figure 11:
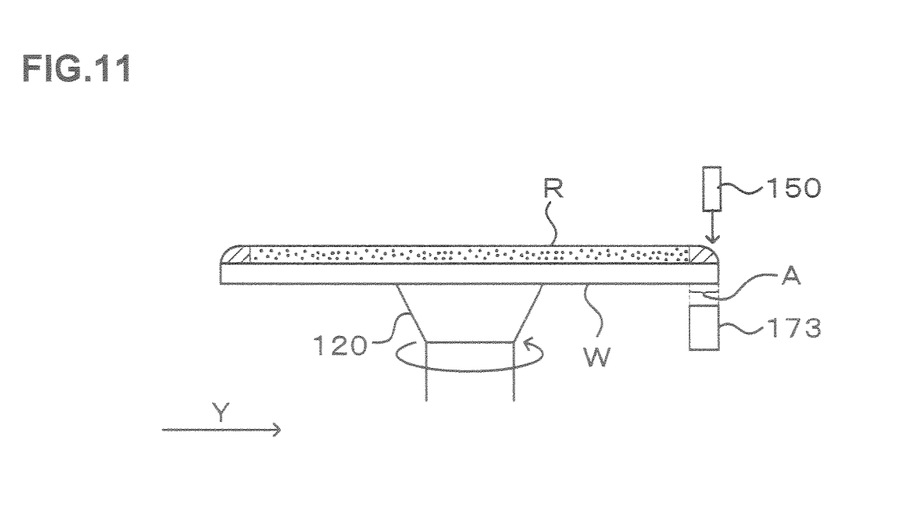
FIG. 11 A longitudinal sectional view of the wafer showing an appearance in which a solvent is supplied while the laser light is being applied.

At the time of the resist coating treatment when the resist film R with the predetermined thickness is formed on the wafer W, the far-infrared laser light is applied to the rear surface side of the outer peripheral portion A of the wafer W by the laser irradiation member 173 with the wafer W continuously rotated. The application of the laser light supplies heat to the resist film R on the outer peripheral portion A of the wafer W through the wafer W to dry the resist film R on the outer peripheral portion A. Thereafter, the solvent supply nozzle 150 moves to a position opposed to the laser irradiation member 173, that is a position above the edge portion Ae of the wafer W on the positive direction side in the Y-direction as shown in FIG. 11. The solvent is supplied by the solvent supply nozzle 150 onto the resist film R on the edge portion Ae of the wafer W with the laser irradiation member 173 kept applying the laser light and the wafer W kept rotating, thereby removing the resist film R on the edge portion Ae.

According to the above example, since the laser irradiation member 173 is provided on the rear surface side of the wafer W, impurities such as dust and so on from never fall onto the wafer W, for example, from the laser irradiation member 173 and its drive system, so that adherence of the impurities to the resist film R can be prevented. It is also possible to prevent the laser irradiation member 173 from being contaminated with the volatile substance from the resist film R.

Further, the laser irradiation member 173 is configured to be able to move to the position opposed to the solvent supply nozzle 150 at the time when discharging the solvent, and therefore, during the time when the supply of the solvent and the application of the laser light are performed at the same time, the laser light radiated from the laser irradiation member 173 can be interrupted and absorbed by the solvent discharged from the solvent supply nozzle 150. This can prevent a portion of the laser light from leaking toward the upper side of the wafer W and scattering in the casing 20a to thereby prevent for example the heat generated by the laser light from being unevenly applied to the front surface of the resist film R and thus causing non-uniformity in film quality of the resist film R.

Figure 12:
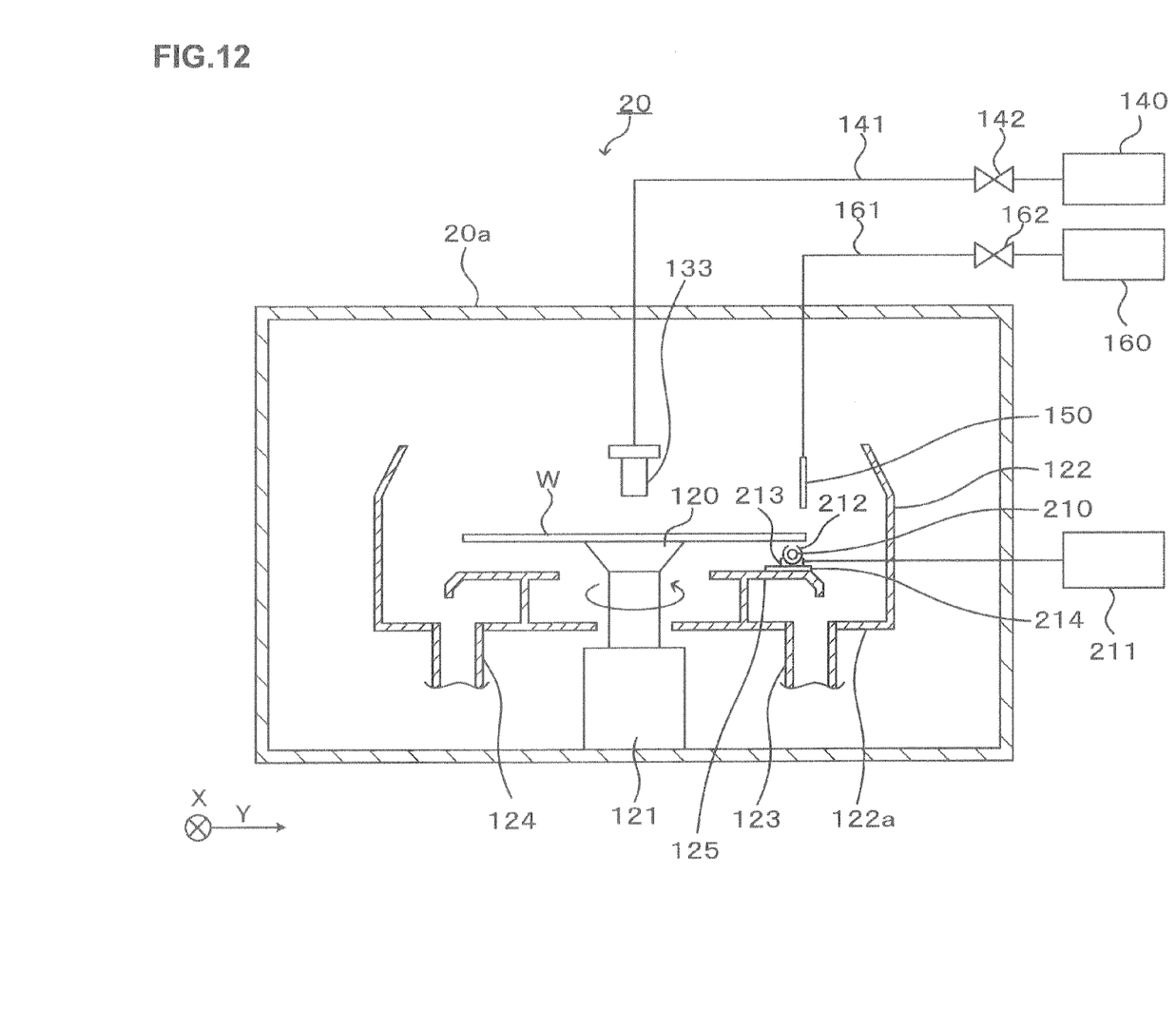
FIG. 12 An explanatory view of a longitudinal section showing the outline of a configuration of the resist coating unit in which a lamp heater is provided below the wafer.
Figure 13:
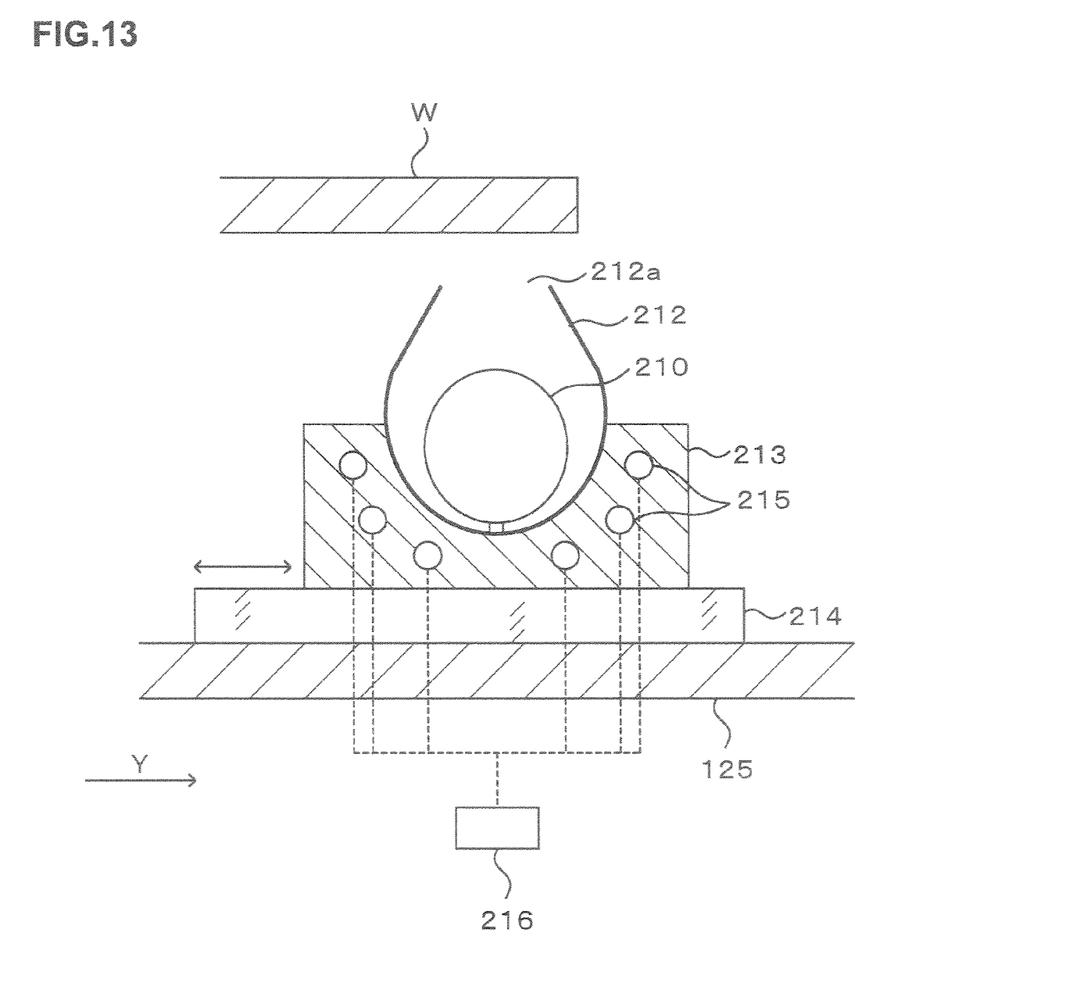
FIG. 13 An explanatory view showing a configuration around the lamp heater.

While the laser irradiation member 173 is used to apply heat to the resist film R on the outer peripheral portion A of the wafer W in the above-described embodiment, a lamp heater may be used to apply heat. In this case, a lamp heater 210 is provided for example, on the rear surface side of the wafer W held on the spin chuck 120 as shown in FIG. 12. The lamp heater 210 can apply light by feed from a heater power supply 211. As the light of the lamp heater 210, a far-infrared ray having, for example, a wavelength of about 1000 nm to about 1200 nm is used, which can pass through the wafer W to dry the resist film R. The lamp heater 210 is covered, for example, by a reflector 212 which reflects heat wave toward the rear surface side of the wafer W as shown in FIG. 13. The reflector 212 is formed in an almost spherical shape to encompass the heater lamp 210, and formed with an opening portion 212a on the rear surface side of the wafer W, which allows heat wave to pass therethrough. The reflector 212 is formed, for example, such that it is tapered as it approaches the opening portion 212a on the rear surface side of the wafer W.

The reflector 212 is supported, for example, on a support member 213 in intimate contact with the lower surface of the reflector 212. The support member 213 is attached, for example, to a rail 214 extending along a direction of the diameter of the wafer W on the horizontal plate 125, and can move on the rail 214. This allows the lamp heater 210 to move along the rail 214 to a position below the outer peripheral portion of the wafer W that is, to a position opposed to the solvent supply nozzle 150 at the time when discharging the solvent with the wafer W intervening therebetween.

The support member 213 is made of a material excellent in thermal conductivity and has cooling pipes 215 therein which allows cooling water for cooling to flow therethrough. The cooling pipes 215 are in communication, for example with a cooling water supply source 216 located outside the casing 20a. The cooling pipes 215 car be used to cool the support member 213 and the reflector 212 in intimate contact with the support, member 213 so as to prevent the heat generated by the lamp heater 210 from being conducted to the cup 122 side through the support member 213. Furthers it is possible to prevent the reflector 212 from rising in temperature and resultantly thermally affecting the wafer W.

At the time of resist coating treatment, after the resist film R with the predetermined thickness is formed on the wafer W, the lamp heater 210 applies the far-infrared light to the rear surface side of the outer peripheral portion A of the wafer W with the wafer W kept rotating. The application of the light supplies heat to the resist film R on the outer peripheral portion A of the wafer W through the wafer W to dry the resist film R on the outer peripheral portion A. The solvent supply nozzle 150 then moves to a position opposed to the lamp heater 210, that is, a position above the edge portion Ae of the wafer W on the positive direction side in the Y-direction. The solvent is supplied by the solvent supply nozzle 150 onto the resist film R on the edge portion Ae of the wafer W with the lamp heater 210 kept applying light and the wafer W kept rotating, thereby removing the resist film R on the edge portion Ae.

According also to the above example, after the resist film R is formed on the wafer W, the heat is applied to the resist film R on the outer peripheral portion A of the wafer W, so that the resist film R on the outer peripheral portion A can dry in a short time. Further, the heat can be continuously applied to the resist film R on the entire outer peripheral portion A of the wafer W during the supply of the solvent to the resist film R on the edge portion Ae, thereby preventing the resist film R on the inner side of the edge portion Ae from dissolving with the solvent and flowing into a portion thereof to be removed. Further, since the reflector 212 is formed such as to cover the lamp heater 210 and formed such that it is tapered toward the opening portion 212*a* on the rear surface side of the wafer W in the above example, it is possible to prevent the solvent discharged from the solvent supply nozzle from accidentally dropping onto the lamp heater 210 and contaminating the lamp heater 210.

The laser irradiation member 173 or the lamp heater 210 located on the rear surface side of the wafer W described in the above embodiment may be moved to the side of the central portion of the wafer W except for the time of heat radiation, such as at the time of formation of the resist film R. This can prevent the laser irradiation member 173 and the lamp heater 210 from being contaminated with the resist solution scattering or dropping from the wafer W.

Examples of the embodiment of the present invention have been described above but the present invention is not limited to the examples and can take various forms. While in the resist coating unit 20 for applying the resist solution to the wafer W has been described in the above embodiment, the present invention is also applicable to a coating treatment unit for applying a coating solution other than the resist solution such as a coating solution to the wafer W to form, for example an SOD, SOG (Spin on Glass) film or the like. Further, the present invention is also applicable to the case of applying a coating solution to a substrate other than the wafer, such as an FPD (Flat Panel Display), a mask reticle for a photomask, and the like.

INDUSTRIAL APPLICABILITY

The invention is useful in shortening the coating treatment time to form a coating film on a substrate.

What is claimed:

1. A coating treatment apparatus for supplying a coating solution to a substrate to treat the substrate, comprising:
    a coating solution supply member for supplying the coating solution onto the substrate to form a coating film on the substrate;
    a heat supply member for supplying heat to the coating film on an outer peripheral portion of the substrate; and
    a solvent supply member for supplying a solvent for the coating film to the coating film on an edge portion of the substrate on an outer side in a region to which the heat is supplied by said heat supply member, wherein
    said heat supply member is located on a rear surface side of the substrate, and
    said heat supply member and said solvent supply member are movable to positions opposed to each other with the outer peripheral portion of the substrate intervening therebetween.

2. The coating treatment apparatus as set forth in claim 1, wherein said heat supply member is a laser irradiation member.

3. The coating treatment apparatus as set forth in claim 1, wherein said heat supply member is a lamp heater,
    wherein said lamp heater is provided with a reflector for reflecting heat wave of said lamp heater toward the rear surface side of the substrate,
    wherein said reflector is formed to cover a periphery of said lamp heater and further has, on the substrate side, an opening portion through which the heat wave passes, and
    wherein said reflector is formed such that said reflector is tapered as said reflector approaches the opening portion on the substrate side.

4. The coating treatment apparatus as set forth in claim 1, wherein said heat supply member moves to a center side of the substrate except for a time of the supply of heat.

\* \* \* \* \*